(12) United States Patent
Chiou et al.

(10) Patent No.: US 9,715,922 B1
(45) Date of Patent: Jul. 25, 2017

(54) SINGLE PORT SRAM MEMORY CELL DRIVEN BY TWO WORD LINES IN ASYNCHRONOUS MANNER AND MEMORY EMPLOYING THE SAME

(71) Applicant: National Cheng Kung University, Tainan (TW)

(72) Inventors: Lih-Yih Chiou, Tainan (TW); Chi-Ray Huang, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 15/264,599

(22) Filed: Sep. 14, 2016

(30) Foreign Application Priority Data

Jan. 21, 2016 (TW) .............................. 105101927 A

(51) Int. Cl.
| | |
|---|---|
| *G11C 11/412* | (2006.01) |
| *G11C 11/00* | (2006.01) |
| *G11C 11/419* | (2006.01) |
| *G11C 14/00* | (2006.01) |

(52) U.S. Cl.
CPC ............ *G11C 11/412* (2013.01); *G11C 11/00* (2013.01); *G11C 11/419* (2013.01); *G11C 14/00* (2013.01)

(58) Field of Classification Search
CPC .............................. G11C 11/412; G11C 11/419
See application file for complete search history.

(56) References Cited

U.S. PATENT DOCUMENTS

| | | | | |
|---|---|---|---|---|
| 6,744,661 | B1 * | 6/2004 | Shubat | G11C 11/412 365/154 |
| 6,853,578 | B1 * | 2/2005 | Zhang | G11C 11/412 365/154 |
| 7,050,324 | B2 | 5/2006 | Cummings et al. | |
| 7,099,189 | B1 * | 8/2006 | Plants | G11C 11/412 365/154 |
| 7,295,459 | B2 * | 11/2007 | Islam | G11C 11/412 365/154 |
| 8,300,490 | B2 | 10/2012 | Moriwaki | |
| 8,971,096 | B2 * | 3/2015 | Jung | G11C 11/419 365/154 |
| 2005/0180198 | A1 | 8/2005 | Hayashi et al. | |

(Continued)

FOREIGN PATENT DOCUMENTS

| | | |
|---|---|---|
| TW | I228722 | 3/2005 |
| TW | I290717 | 12/2007 |

*Primary Examiner* — Harry W Bryne
*Assistant Examiner* — Ajay Ojha
(74) *Attorney, Agent, or Firm* — Chieh-Mei Wang

(57) ABSTRACT

A memory comprised of a plurality of single port SRAM memory cells, each driven by two word lines in an asynchronous manner has a hold mode, a read mode and a write mode. Each of the single port SRAM memory cells includes a first write switch, a second write switch and a latch. The first write switch is electrically connected to a first word line and is turned on by a first turn-on signal transmitted by the first word line. The second write switch is electrically connected to a second word line and is turned on by a second turn-on signal transmitted by the second word line. When the memory is in the write mode, the second write switch is turned on by the second turn-on signal having a delay with respect to the first turn-on signal, thereby blocking the pseudo read of the unselected memory cell.

14 Claims, 8 Drawing Sheets

(56) References Cited

U.S. PATENT DOCUMENTS

| | | |
|---|---|---|
| 2006/0176727 A1 | 8/2006 | Liu |
| 2012/0120717 A1* | 5/2012 | Sekigawa ........... H01L 27/1104 |
| | | 365/156 |
| 2012/0230086 A1* | 9/2012 | Chiu .................... G11C 11/412 |
| | | 365/154 |

* cited by examiner

SINGLE PORT SRAM MEMORY CELL DRIVEN BY TWO WORD LINES IN ASYNCHRONOUS MANNER AND MEMORY EMPLOYING THE SAME

TECHNICAL FIELD

The present invention relates to a memory cell driven by two word lines in an asynchronous manner and a memory employing the aforementioned memory cell, and more particularly to a memory cell configured to turn on the two writes switches therein in an asynchronous manner thereby blocking the unselected memory cell and a memory employing the aforementioned memory cell.

BACKGROUND

Power consumption is an important consideration in wireless sensor network application. In order to extend the use time of the applications, low-power system chip with lower power consumption is required. In a system chip, static random access memory consumes the majority of the power consumption. Therefore, in order to reduce the power consumption of a static random access memory, some technologies such as modulating the voltage scaling to near-threshold voltage or sub-threshold voltage have been developed.

Conventional, the characteristics of a memory may vary with the advanced manufacturing process and the reduction of source voltage (VDD). For example, when the source voltage is reduced, the signal level of a related signal as well as the noise margin is consequently reduced. Once the noise margin is smaller than a safe value (for example, 0), the memory may not work normally. In general, a memory may be operated in a read mode, a write mode or a hold mode. In the read mode, the memory has the smallest noise margin; in the hold mode, the memory has the largest noise margin; and in the write mode, the memory has a noise margin in between. In addition, when the memory performs a data writing operation, the unselected memory cell in a memory matrix may be affected by a noise and is in a pseudo read mode; and therefore, the stored data may have errors.

In order to solve the issue of a memory in read mode having the smallest noise margin, a circuit design of memory is provided by using 8T memory unit with separated read and write functions. Because the transistors for read function are separated, the noise margin in the read mode is increased as large as the noise margin in the hold mode. However, the circuit design by separating the transistors for read function and write function may need extra two transistors. Thus, compared with the 6T memory unit, the 8T memory unit requires extra 40% of circuit area and still cannot solve the pseudo read issue.

Another circuit design is provided to solve the issues of the read mode having the smallest noise margin and the pseudo read. In this circuit design, the feature of read prior to write is adopted besides of the feature of read and writes separation. Further, the pseudo read issue may be also solved by a circuit design by dividing the word lines into horizontal word lines and vertical word lines. However, the aforementioned two circuit designs may require extra transistors (such as 8T, 10T, 12T or even more) and extra power consumption.

In order to solve the issues of the read mode having the smallest noise margin and the pseudo read without employing extra transistors, a circuit design is provided by employing 6T memory unit with hierarchical bit-line design. It is to be known that the noise margin in read mode increases with the decrement of the number of memory unit on the bit line due to that the fewer number of the memory unit may result in the faster the rate of discharge and the shorter the time memory unit affected by noise. However, the number of the memory unit on bit line, the noise margin and the circuit area of the memory matrix the three must be properly adjusted. For example, if the smaller circuit area of a memory matrix is desired, the number of the memory unit on bit line must be reduced and consequently a reduced noise is resulted.

Therefore, it is quite important to provide a memory having advantages such as having a large noise margin in read and pseudo read modes, capable of operating under an ultra-low voltage and having lower power consumption but without having to sacrifice area density of the memory matrix.

SUMMARY

One object of the present invention is to provide a memory cell driven by two word lines in an asynchronous manner and having increased noise margin in read and pseudo read modes.

Another object of the present invention is to provide a memory cell driven by two word lines in an asynchronous manner and having increased circuit density of memory matrix.

Still another object of the present invention is to provide a memory employing the aforementioned memory cell and being able operated under an ultra-low voltage.

The present invention provides a memory cell driven by two word lines in an asynchronous manner. A plurality of the memory cells form a memory matrix disposed in a memory. The memory has a hold mode, a read mode and a write mode. The memory includes a first word line, a second word line and a bit line. The memory cell receives a first turn-on signal transmitted by the first word line, a second turn-on signal transmitted by the second word line and write data transmitted by the bit line. The second turn-on signal has a delay with respect to the first turn-on signal when the memory is in the write mode. The memory cell includes a first write switch, a second write switch and a latch. The first write switch is electrically connected to the first word line. When the memory is in the read mode or the write mode, the first write switch is turned on by the first turn-on signal and transmits the write data derived from the bit line. The second write switch is electrically connected to the second word line. When the memory is in the hold mode, the second write switch is turned on by the second turn-on signal. When the memory is in the write mode, the second write switch is turned on by the second turn-on signal having a delay with respect to the first turn-on signal and transmits the write data derived from the bit line. The latch is electrically connected to the first write switch and the second write switch. When the memory is in the write mode and both of the first write switch and the second write switch are turned on, the latch is configured to receive and store the write data.

The present invention further provides a memory composed of a plurality of memory cells driven by two word lines in an asynchronous manner. The memory has a hold mode, a read mode and a write mode. The memory includes a plurality of first word lines, a plurality of second word lines, a plurality of a bit lines and a memory matrix. Each first word line is configured to transmit a first turn-on signal. Each second word line is configured to transmit a second turn-on signal. When the memory is in the write mode, the second turn-on signal has a delay with respect to the respective first turn-on signal. Each bit line is configured to transmit write data. The memory matrix is formed by the plurality of memory cells. The memory cells are electrically connected to the first word lines, the second word lines and the bit lines, and from which to receive the first turn-on signal, the second turn-on signal and the write data, respectively. Each memory cell includes a first write switch, a second write switch and a latch. The first write switch is electrically connected to one of the plurality of first word lines. When the memory is in the read mode or the write mode, the first write switch is turned on by the first turn-on signal and transmits the write data derived from one of the plurality of bit lines. The second write switch is electrically connected to one of the plurality of second word lines. When the memory is in the hold mode, the second write switch is turned on by the second turn-on signal. When the memory is in the write mode, the second write switch is turned on by the second turn-on signal having a delay with respect to the first turn-on signal and transmits the write data derived from one of the plurality of bit lines. The latch is electrically connected to the first write switch and the second write switch. When the memory is in the write mode and both of the first write switch and the second write switch are turned on, the latch is configured to receive and store the write data.

In summary, the present invention provides a memory cell driven by two word lines in an asynchronous manner and a memory employing the aforementioned memory cell. In the present invention, the first write switch and the second write switch in the memory cell are turned on in an asynchronous manner. Specifically, before the memory performs the data writing operation, the second write switch is turned on after the first write switch; thus, the noise generated by the bit line can be discharged and consequently the unselected memory cell is prevented from having pseudo read resulted by the noise. In the present invention, because only the turn-on time of the first and second write switches is required to be controlled and no any additional memory unit is needed, the memory cell of the present invention can be implemented by 6T memory unit. Therefore, the area density of the memory matrix is increased and the noise margin of the memory is improved, and consequently the memory can be operated under an ultra-low voltage and has advantages such as low power consumption.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
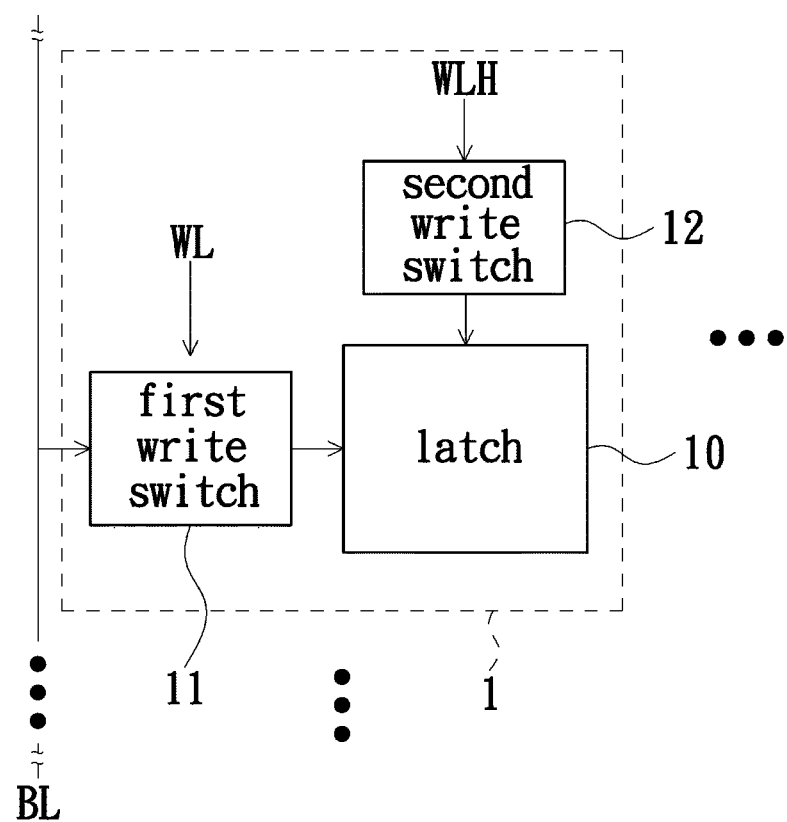
FIG. 1 is a schematic view of a memory composed of a plurality of memory cells driven by two word lines in an asynchronous manner in accordance with an embodiment of the present invention.
Figure 2:
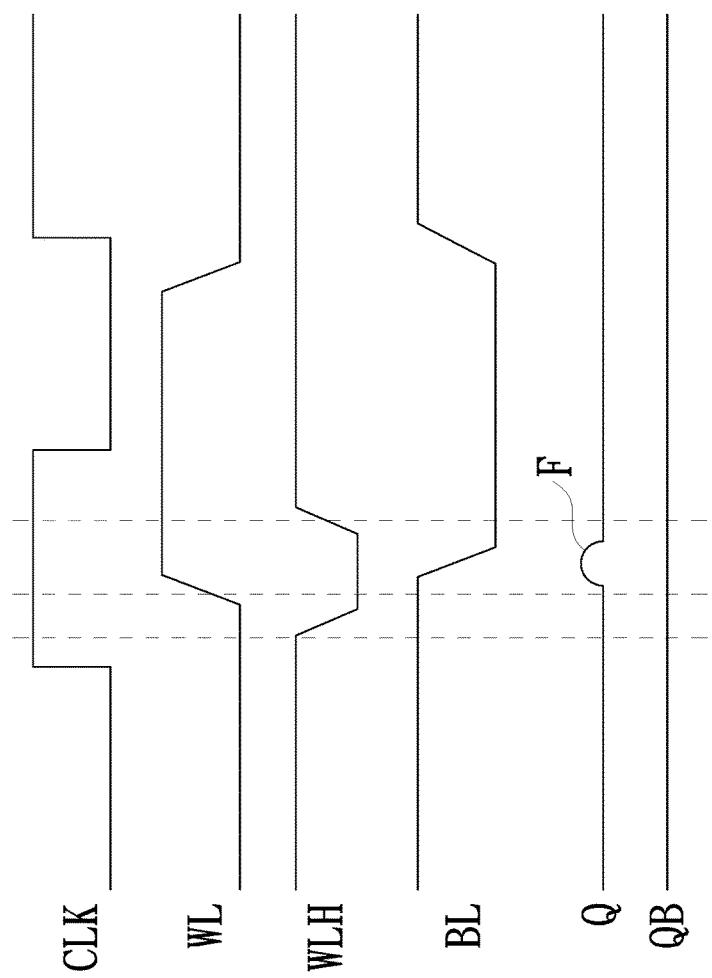
FIG. 2 is a waveform diagram of the signals associated with the memory cell in FIG. 1 in accordance with an embodiment of the present invention.

FIG. 1 is a schematic view of a memory composed of a plurality of memory cells driven by two word lines in an asynchronous manner in accordance with an embodiment of the present invention. The memory of the present embodiment has a hold mode, a read mode and a write mode. As shown in FIG. 1, the memory of the present embodiment includes a plurality of first word lines WL, a plurality of second word lines WLH, a plurality of bit lines BL and a memory matrix. The first word line WL is configured to transmit a first turn-on signal and the second word line WLH is configured to transmit a second turn-on signal. Please refer to FIG. 2, which is a waveform diagram of the signals associated with the memory cell in FIG. 1 in accordance with an embodiment of the present invention. As shown in FIG. 2, the second turn-on signal transmitted on the second word line WLH has a delay with respect to the first turn-on signal transmitted on the first word line WL within a certain period (e.g., when the memory is in the write mode).

As shown in FIG. 1, the memory matrix is formed by a plurality of memory cells 1 driven by two word lines in an asynchronous manner. Each memory cell 1 is electrically connected to a respective first word line WL, a respective second word line WLH and a respective bit line BL, and from which to receive the first turn-on signal, the second turn-on signal and write data, respectively. The memory cell 1 includes a first write switch 11, a second write switch 12 and a latch 10. The first write switch 11 is electrically connected to the first word line WL. Specifically, when the memory is in the read mode or the write mode, the first write switch 11 is turned on by the first turn-on signal and transmits the write data derived from the bit line BL. The second write switch 12 is electrically connected to the second word line WLH. Specifically, when the memory is in the hold mode, the second write switch 12 is turned on by the second turn-on signal having a delay with respect to the first turn-on signal and transmits the write data derived from the bit line BL.

Figure 3:
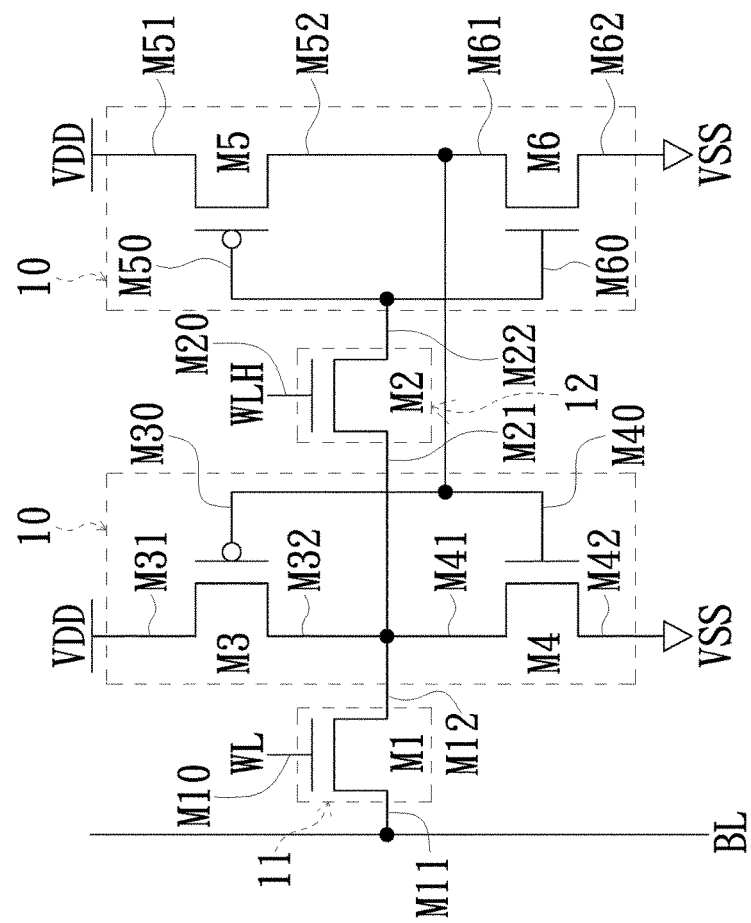
FIG. 3 is a schematic circuit view of the memory cell in FIG. 1 in accordance with an embodiment of the present invention.

FIG. 3 is a schematic circuit view of the memory cell 1 in FIG. 1 in accordance with an embodiment of the present invention. As shown in FIG. 3, the first write switch 11 includes a first transistor M1. The second write switch 12 includes a second transistor M2. The latch 10 includes a third transistor M3, a fourth transistor M4, a fifth transistor M5 and a sixth transistor M6. In the present embodiment, the first transistor M1, the second transistor M2, the fourth transistor M4 and the sixth transistor M6 are N-type transistors; and the third transistor M3 and the fifth transistor M5 are P-type transistors. Each one of the first transistor M1, the second transistor M2, the third transistor M3, the fourth transistor M4, the fifth transistor M5 and the sixth transistor M6 has a first source/drain, a second source/drain and a gate. Specifically, the gate M10 of the first transistor M1 is electrically connected to the first word line WL; the first source/drain M11 of the first transistor M1 is electrically connected to the bit line BL; the second source/drain M12 of the first transistor M1 is electrically connected to the first source/drain M21 of the second transistor M2, the second source/drain M32 of the third transistor M3 and the first source/drain M41 of the fourth transistor M4; the gate M20 of the second transistor M2 is electrically connected to the second word line WLH; the second source/drain M22 of the second transistor M2 is electrically connected to the gate M50 of the fifth transistor M5 and the gate M60 of the sixth transistor M6; the gate M30 of the third transistor M3 is electrically connected to the gate M40 of the fourth transistor M4, the second source/drain M52 of the fifth transistor M5 and the first source/drain M61 of the sixth transistor M6; the first source/drain M31 of the third transistor M3 is electrically connected to a source voltage VDD; the second source/drain M42 of the fourth transistor M4 is electrically connected to a reference voltage VSS; the first source/drain M51 of the fifth transistor M5 is electrically connected to the source voltage VDD; and the second source/drain M62 of the sixth transistor M6 is electrically connected to the reference voltage VSS.

When the memory of the present embodiment is in the hold mode, the bit line BL is pr-charged and the first turn-on signal on the first word line WL is 0 and accordingly the first transistor M1 is turned off. Therefore, the data stored in the latch 10 is prevented from being affected by the pre-charged bit line BL. Further, in the hold mode, the second turn-on signal on the second word line WLH is 1 and accordingly the second transistor M2 is turned on. Therefore, the third transistor M3, the fourth transistor M4, the fifth transistor M5 and the sixth transistor M6 of the latch 10 are connected to hold the data stored therein.

Figure 4:
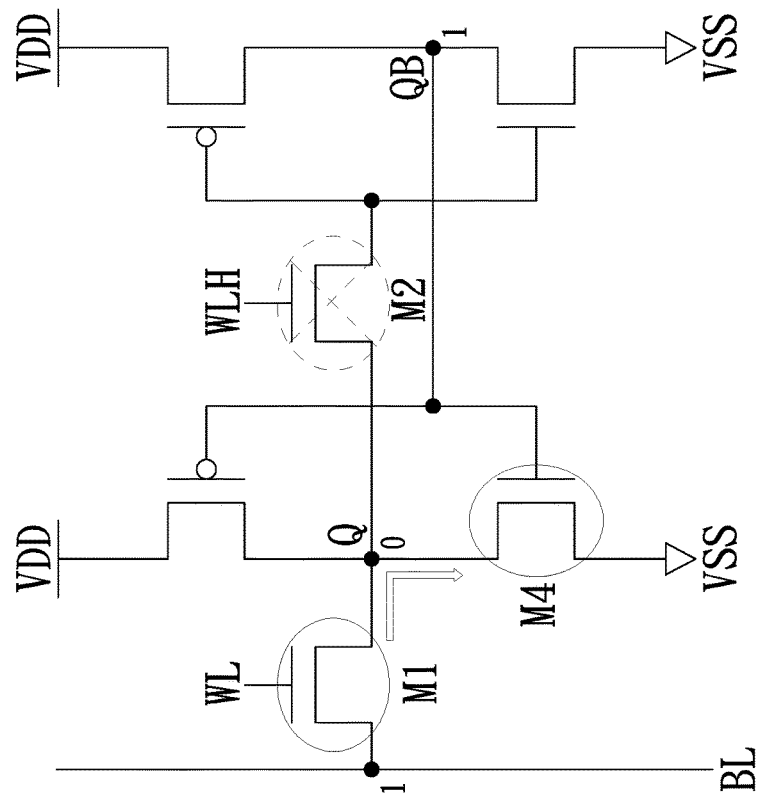
FIG. 4 is a schematic circuit view illustrating an operation of a memory cell when the memory is in the read mode in accordance with an embodiment of the present invention.

FIG. 4 is a schematic circuit view illustrating an operation of a memory cell when the memory is in the read mode in accordance with an embodiment of the present invention. As shown, when the memory of the present embodiment is in the read mode, the first turn-on signal on the first word line WL is 1 and accordingly the first transistor M1 is turned on; and the second turn-on signal on the second word line WLH is 0 and accordingly the second transistor M2 is turned off. Therefore, when the data derived from the bit line BL has floating and results in a noise F, the noise F at a node Q will be discharged to the reference voltage VSS through the first transistor M1 and the fourth transistor M4 due to that the second transistor M2 is turned off. Therefore, the fifth transistor M5 and the sixth transistor M6 of the latch 10 can hold the data stored therein. The third transistor M3, the fourth transistor M4, the fifth transistor M5 and the sixth transistor M6 of the latch 10 are connected to hold the data stored therein.

Before the memory of the present embodiment performs the data writing, the first turn-on signal on the first word line WL is 1 and accordingly the first transistor M1 is turned on; and the second turn-on signal having a delay with respect to the first turn-on signal and transmitted on the second word line WLH is temporarily 0 and accordingly the second transistor M2 is still turned off. Therefore, even the data derived from the bit line BL generates a noise, the noise will be discharged to the reference voltage VSS through the first transistor M1 and the fourth transistor M4 due to that the second transistor M2 is still turned off. Therefore, the data stored in the unselected memory cells 1 in the memory matrix is prevented from being affected by the noise generated by the bit line BL. After a while when the data on the bit line BL is pre-discharged to 0, the second turn-on signal on the second word line WLH is converted from 0 to 1 and accordingly the second transistor M2 is turned on. Therefore, both of the first transistor M1 and the second transistor M2 are turned on and the selected memory cell 1 completes the write operation.

Figure 5:
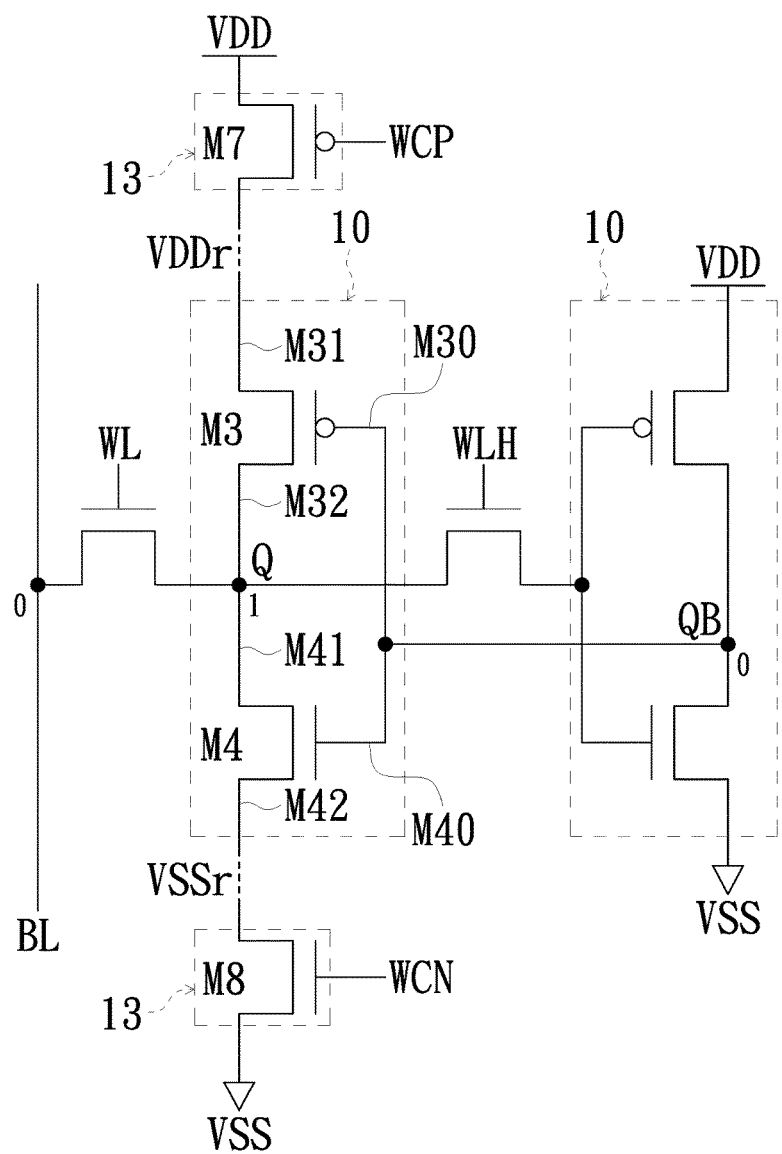
FIG. 5 is a schematic circuit view of a memory cell driven by two word lines in an asynchronous manner in accordance with another embodiment of the present invention.

FIG. 5 is a schematic circuit view of a memory cell driven by two word lines in an asynchronous manner in accordance with another embodiment of the present invention. As shown in FIG. 5, the memory cell of the present embodiment includes the latch 10 and an auxiliary write switch 13. The auxiliary write switch 13 is electrically connected to auxiliary lines WCP, WCN and the latch 10. The auxiliary write switch 13 is configured to receive auxiliary start signals transmitted from the auxiliary lines WCP, WCN, respectively. The auxiliary write switch 13 includes a seventh transistor M7 and an eighth transistor M8. The seventh transistor M7 is a P-type transistor and the eighth transistor M8 is an N-type transistors. Each one of the seventh transistor M7 and the eighth transistor M8 has a first source/drain, a second source/drain and a gate. The seventh transistor M7 is disposed on the electrical path between the third transistor M3 of the latch 10 and the source voltage VDD. Specifically, the gate M70 of the seventh transistor M7 is electrically connected to the auxiliary line WCP; the first source/drain M71 of the seventh transistor M7 is electrically connected to the source voltage VDD; and the second source/drain M72 of the seventh transistor M7 is electrically connected to the first source/drain M31 of the third transistor M3. The eighth transistor M8 is disposed on the electrical path between the fourth transistor M4 of the latch 10 and the reference voltage VSS. Specifically, the gate M80 of the eighth transistor M8 is electrically connected to the auxiliary line WCN; the first source/drain M81 of the eighth transistor M8 is electrically connected to the second source/drain M42 of the fourth transistor M4; and the second source/drain M82 of the eighth transistor M8 is electrically connected to the reference voltage VSS.

Figure 6:
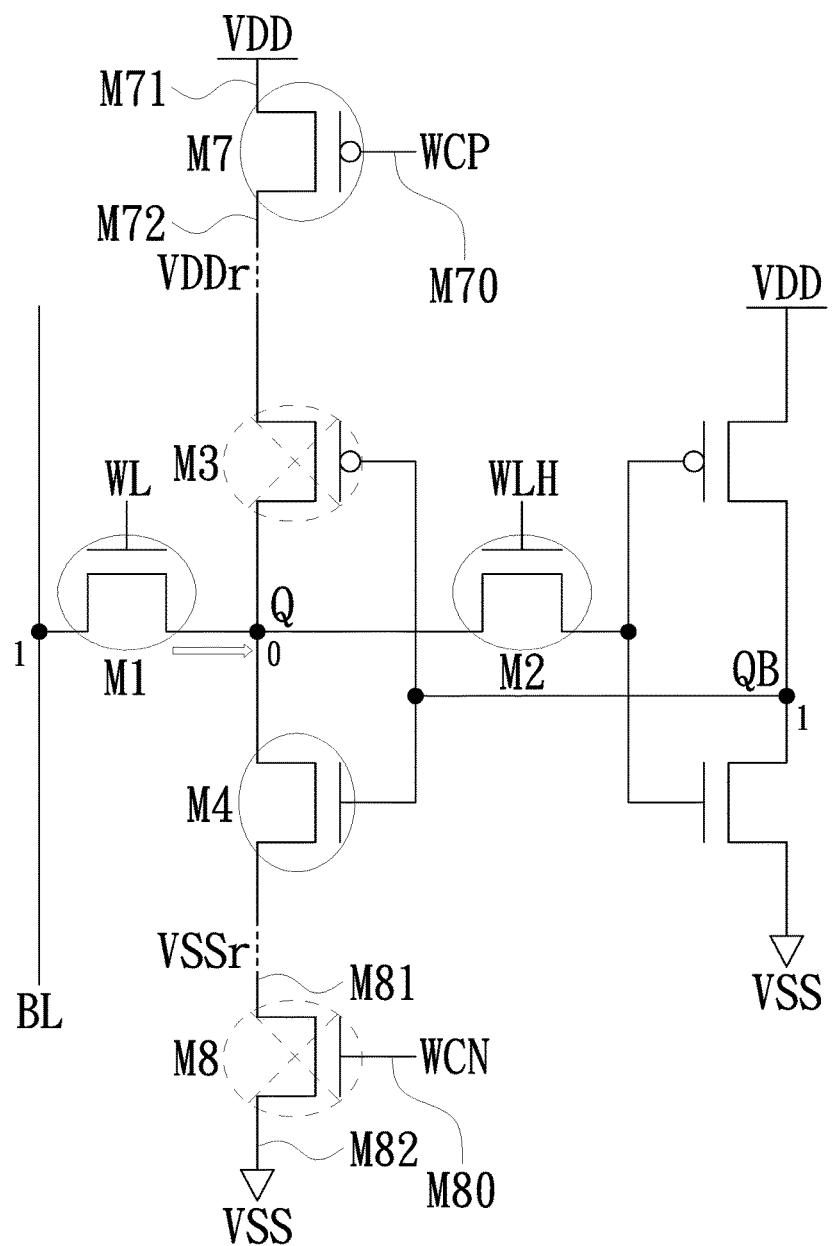
FIG. 6 is a schematic circuit view illustrating an operation of a selected memory cell when the write data is 1 and the store data Q is 0 in accordance with an embodiment of the present invention.
Figure 7:
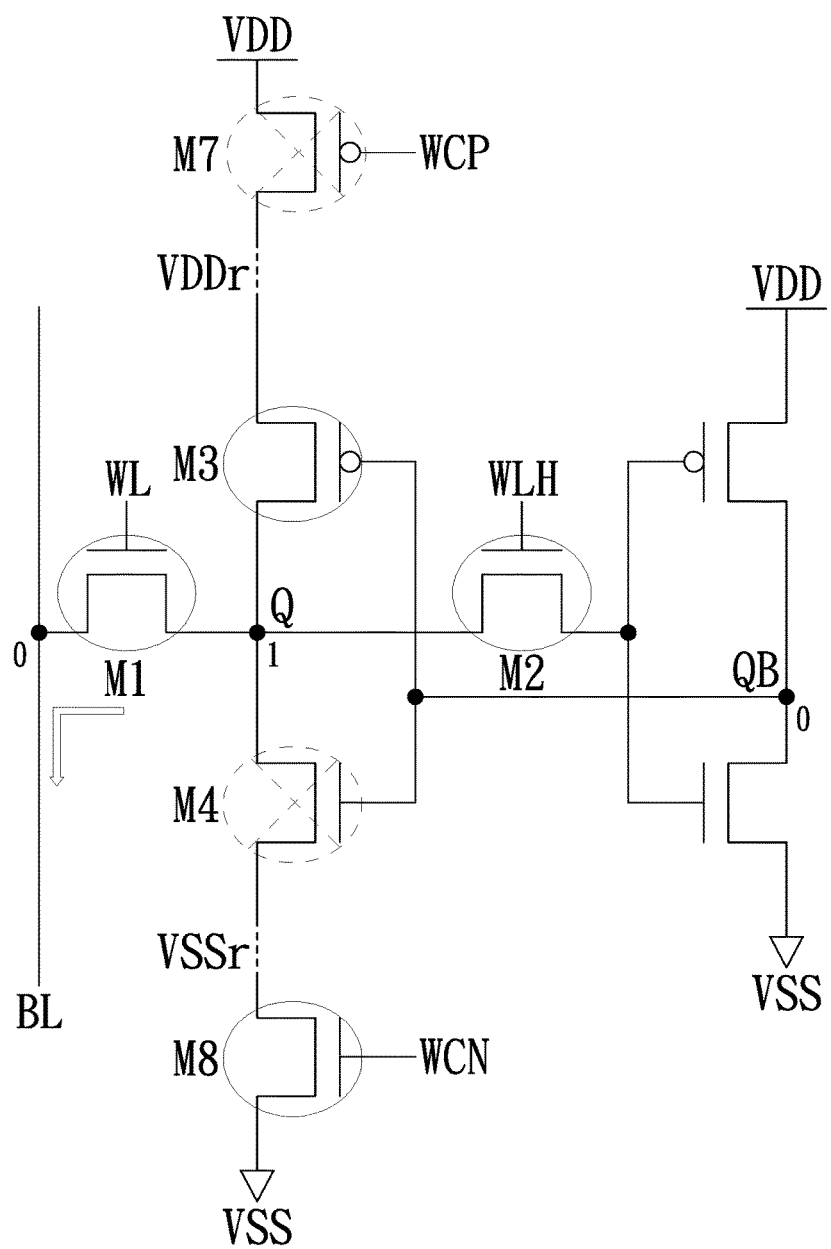
FIG. 7 is a schematic circuit view illustrating an operation of a selected memory cell when the write data is 0 and the store data Q is 0 in accordance with an embodiment of the present invention.

FIG. 6 is a schematic circuit view illustrating an operation of a selected memory cell when the write data is 1 and the store data Q is 0 in accordance with an embodiment of the present invention. As shown in FIG. 6, because the auxiliary start signal on the auxiliary line WCP is 0, the first transistor M1, the second transistor M2, the fourth transistor M4 and the seventh transistor M7 are turned on and the third transistor M3 is turned off. In addition, because the auxiliary start signal on the auxiliary line WCN is 0, the eighth transistor M8 is turned off. Therefore, the selected memory cell can perform a data writing operation. FIG. 7 is a schematic circuit view illustrating an operation of a selected memory cell when the write data is 0 and the store data Q is 0 in accordance with an embodiment of the present invention. As shown in FIG. 7, because the auxiliary start signal on the auxiliary line WCP is 1, the first transistor M1, the second transistor M2, the third transistor M3 and the eighth transistor M8 are turned on and the fourth transistor M4 and the seventh transistor M7 are turned off. When the memory cell is in the hold mode or the write mode, the auxiliary start signal on the auxiliary line WCP is 0 to maintain the seventh transistor M7 to be turned on and the auxiliary start signal on the auxiliary line WCN is 1 to maintain the eighth transistor M8 to be turned on.

In the above embodiments shown in FIGS. 5, 6 and 7, the seventh transistor M7 and the eighth transistor M8 are commonly used by one column (not shown) thereby saving the area of the cell. Namely, each column includes a pair of the seventh transistor M7 and the eighth transistor M8, so that the circuit consisted by the memory cells of the present embodiments shown in FIGS. 5, 6 and 7 has improved array density.

Figure 8:
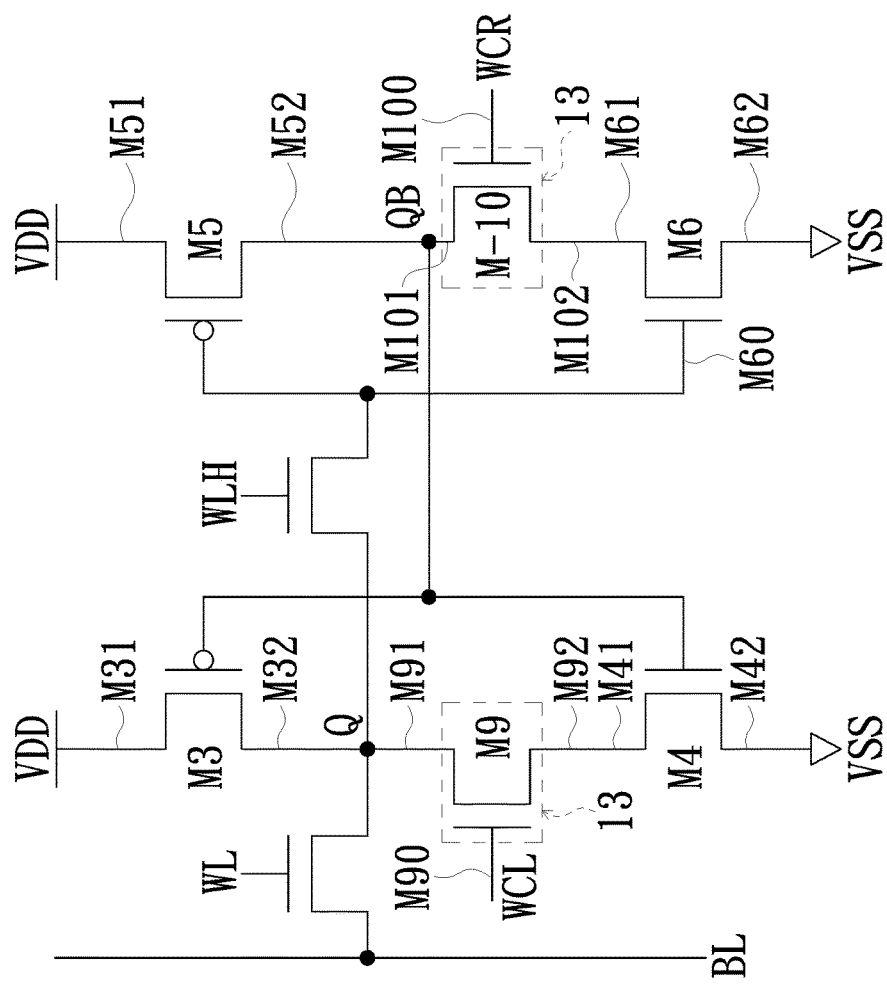
FIG. 8 is a schematic circuit view of a memory cell driven by two word lines in an asynchronous manner in accordance with still another embodiment of the present invention.

FIG. 8 is a schematic circuit view of a memory cell driven by two word lines in an asynchronous manner in accordance with still another embodiment of the present invention. As shown in FIG. 8, the auxiliary write switch 13 includes a ninth transistor M9 and a tenth transistor M-10. Both of the ninth transistor M9 and the tenth transistor M-10 are N-type transistors. Each one of the ninth transistor M9 and the tenth transistor M-10 has a first source/drain, a second source/drain and a gate. The ninth transistor M9 is disposed on the electrical path between the third transistor M3 and the fourth transistor M4. Specifically, the gate M90 of the ninth transistor M9 is electrically connected to an auxiliary line WCL; the first source/drain M91 of the ninth transistor M9 is electrically connected to the second source/drain M32 of the third transistor M3; and the second source/drain M92 of the ninth transistor M9 is electrically connected to the first source/drain M41 of the fourth transistor M4. The tenth transistor M-10 is disposed on the electrical path between the fifth transistor M5 and the sixth transistor M6. Specifically, the gate M100 of the tenth transistor M-10 is electrically connected to an auxiliary line WCR; the first source/drain M101 of the tenth transistor M-10 is electrically connected to the second source/drain M52 of the fifth transistor M5; and the second source/drain M102 of the tenth transistor M-10 is electrically connected to the first source/drain M61 of the sixth transistor M6.

When the memory cell is in the hold mode or the read mode, the auxiliary start signals on the auxiliary lines WCL, WCR are 1 to maintain the ninth transistor M9 and the tenth transistor M-10 to be turned on. When the memory cell is in the write mode, the write data is 1 and the store data Q is 0, the auxiliary start signal on the auxiliary line WCL is 0 to turn off the ninth transistor M9; and the auxiliary start signal on the auxiliary line WCR is 1 to maintain the tenth transistor M-10 to be turned on. When the memory cell is in the write mode, the write data is 0 and the store data Q is 1, the auxiliary start signal on the auxiliary line WCL is 1 to maintain the ninth transistor M9 to be turned on; and the auxiliary start signal on the auxiliary line WCR is 0 to turn off the tenth transistor M-10.

In summary, the present invention provides a memory cell driven by two word lines in an asynchronous manner and a memory employing the aforementioned memory cell. In the present invention, the first write switch and the second write switch in the memory cell are turned on in an asynchronous manner. Specifically, before the memory performs the data writing operation, the second write switch is turned on after the first write switch; thus, the noise generated by the bit line can be discharged and consequently the unselected memory cell is prevented from having pseudo read resulted by the noise. In the present invention, because only the turn-on time of the first and second write switches is required to be controlled and no any additional memory unit is needed, the memory cell of the present invention can be implemented by 6T memory unit. Therefore, the area density of the memory matrix is increased and the noise margin of the memory is improved, and consequently the memory can be operated under an ultra-low voltage and has advantages such as low power consumption.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A single port SRAM memory cell driven by two word lines in an asynchronous manner, wherein a plurality of the single port SRAM memory cells form a memory matrix disposed in a memory, the memory has a hold mode, a read mode and a write mode, the memory comprises a first word line, a second word line and a bit line, the single port SRAM memory cell receives a first turn-on signal transmitted by the first word line, a second turn-on signal transmitted by the second word line and write data transmitted by the bit line, and the second turn-on signal has a delay with respect to the first turn-on signal when the memory is in the write mode, the single port SRAM memory cell comprises:

a first write switch, electrically connected to the first word line, wherein when the memory is in the read mode or the write mode, the first write switch is turned on by the first turn-on signal and transmits the write data transmitted from the bit line;

a second write switch, electrically connected to the second word line, wherein when the memory is in the hold mode, the second write switch is turned on by the second turn-on signal, wherein when the memory is in the write mode, the second write switch is turned on by the second turn-on signal having the delay with respect to the first turn-on signal and transmits the write data derived from the bit line; and a latch, electrically connected to the first write switch and the second write switch, wherein when the memory is in the write mode and both of the first write switch and the second write switch are turned on, the latch is configured to receive and store the write data;

wherein the first write switch comprises a first transistor, the second write switch comprises a second transistor, and the latch comprises a third transistor, a fourth transistor, a fifth transistor and a sixth transistor, wherein the first, second, fourth and sixth transistors are N-type transistors, and the third and fifth transistors are P-type transistors, wherein each one of the first, second, third, fourth, fifth and sixth transistors has a first source/drain, a second source/drain and a gate, wherein the gate of the first transistor is electrically connected to the first word line, the first source/drain of the first transistor is electrically connected to the bit line, the second source/drain of the first transistor is electrically connected to the first source/drain of the second transistor, the second source/drain of the third transistor and the first source/drain of the fourth transistor, the gate of the second transistor is electrically connected to the second word line, the second source/drain of the second transistor is electrically connected to the gates of the fifth and sixth transistors, the gate of the third transistor is electrically connected to the gate of the fourth transistor, the second source/drain of the fifth transistor and the first source/drain of the sixth transistor, the first source/drain of the third transistor is electrically connected to a source voltage, the second source/drain of the fourth transistor is electrically connected to a reference voltage, the first source/drain of the fifth transistor is electrically connected to the source voltage, and the second source/drain of the sixth transistor is electrically connected to the reference voltage.

2. The single port SRAM memory cell according to claim 1, further comprising an auxiliary write switch electrically connected to a first auxiliary line, a second auxiliary line and the latch, wherein the auxiliary write switch is configured to receive auxiliary start signals transmitted from the first and second auxiliary lines, respectively, wherein when the single port SRAM memory cell is selected to store the write data, the auxiliary write switch is turned on by the auxiliary start signals to control the latch to receive and store the write data.

3. The single port SRAM memory cell according to claim 2, wherein the auxiliary write switch comprises a seventh transistor and an eighth transistor, wherein the seventh transistor is a P-type transistor and the eighth transistor is an N-type transistors, wherein each one of the seventh and eighth transistors has a first source/drain, a second source/drain and a gate, wherein the seventh transistor is disposed on an electrical path between the third transistor and the source voltage, the gate of the seventh transistor is electrically connected to the first auxiliary line, the first source/drain of the seventh transistor is electrically connected to the source voltage, and the second source/drain of the seventh transistor is electrically connected to the first source/drain of the third transistor, wherein the eighth transistor is disposed on the electrical path between the fourth transistor and the reference voltage, the gate of the eighth transistor is electrically connected to the second auxiliary line, the first source/drain of the eighth transistor is electrically connected to the second source/drain of the fourth transistor, and the second source/drain of the eighth transistor is electrically connected to the reference voltage.

4. The single port SRAM memory cell according to claim 2, wherein the auxiliary write switch comprises a ninth transistor and a tenth transistor, wherein both of the ninth and tenth transistors are N-type transistors, wherein each one of the ninth and tenth transistors has a first source/drain, a second source/drain and a gate, wherein the ninth transistor is disposed on an electrical path between the third transistor and the fourth transistor, the gate of the ninth transistor is electrically connected to the first auxiliary line, the first source/drain of the ninth transistor is electrically connected to the second source/drain of the third transistor, and the second source/drain of the ninth transistor is electrically connected to the first source/drain of the fourth transistor, wherein the tenth transistor is disposed on an electrical path between the fifth transistor and the sixth transistor, the gate of the tenth transistor is electrically connected to the second auxiliary line, the first source/drain of the tenth transistor is electrically connected to the second source/drain of the fifth transistor, and the second source/drain of the tenth transistor is electrically connected to the first source/drain of the sixth transistor.

5. The single port SRAM memory cell according to claim 1, further comprising an auxiliary write switch electrically connected to a first auxiliary line, a second auxiliary line and the latch, wherein the auxiliary write switch is configured to receive auxiliary start signals transmitted from the first and second auxiliary lines, respectively, wherein when the single port SRAM memory cell is selected to store the write data, the auxiliary write switch is turned on by the auxiliary start signals to control the latch to receive and store the write data.

6. The single port SRAM memory cell according to claim 5, wherein the auxiliary write switch comprises a seventh transistor and an eighth transistor, wherein the seventh transistor is a P-type transistor and the eighth transistor is an N-type transistor, wherein each one of the seventh and eighth transistors has a first source/drain, a second source/drain and a gate, wherein the seventh transistor is disposed on an electrical path between the third transistor and the source voltage, the gate of the seventh transistor is electrically connected to the first auxiliary line, the first source/drain of the seventh transistor is electrically connected to the source voltage, and the second source/drain of the seventh transistor is electrically connected to the first source/drain of the third transistor, wherein the eighth transistor is disposed on the electrical path between the fourth transistor and the reference voltage, the gate of the eighth transistor is electrically connected to the second auxiliary line, the first source/drain of the eighth transistor is electrically connected to the second source/drain of the fourth transistor, and the second source/drain of the eighth transistor is electrically connected to the reference voltage.

7. The single port SRAM memory cell according to claim 5, wherein the auxiliary write switch comprises a ninth transistor and a tenth transistor, wherein both of the ninth and tenth transistors are N-type transistors, wherein each one of the ninth and tenth transistors has a first source/drain, a second source/drain and a gate, wherein the ninth transistor is disposed on an electrical path between the third transistor and the fourth transistor, the gate of the ninth transistor is electrically connected to the first auxiliary line, the first source/drain of the ninth transistor is electrically connected to the second source/drain of the third transistor, and the second source/drain of the ninth transistor is electrically connected to the first source/drain of the fourth transistor, wherein the tenth transistor is disposed on an electrical path between the fifth transistor and the sixth transistor, the gate of the tenth transistor is electrically connected to the second auxiliary line, the first source/drain of the tenth transistor is electrically connected to the second source/drain of the fifth transistor, and the second source/drain of the tenth transistor is electrically connected to the first source/drain of the sixth transistor.

8. A memory comprised of a plurality of single port SRAM memory cells driven by two word lines in an asynchronous manner, wherein the memory has a hold mode, a read mode and a write mode, the memory comprises:
   a plurality of first word lines, each configured to transmit a first turn-on signal;
   a plurality of second word lines, each configured to transmit a second turn-on signal, wherein when the memory is in the write mode, the second turn-on signal has a delay with respect to the respective first turn-on signal;
   a plurality of a bit lines, each configured to transmit write data; and
   a memory matrix, formed by the plurality of single port SRAM memory cells, wherein the single port SRAM memory cells are electrically connected to the first word lines, the second word lines and the bit lines, and from which to receive the first turn-on signal, the second turn-on signal and the write data, respectively, each one of the single port SRAM memory cells comprises:
      a first write switch, electrically connected to one of the plurality of first word lines, wherein when the memory is in the read mode or the write mode, the first write switch is turned on by the first turn-on signal and transmits the write data derived from one of the plurality of bit lines;

a second write switch, electrically connected to one of the plurality of second word lines, wherein when the memory is in the hold mode, the second write switch is turned on by the second turn-on signal, wherein when the memory is in the write mode, the second write switch is turned on by the second turn-on signal having a delay with respect to the first turn-on signal and transmits the write data derived from one of the plurality of bit lines; and a latch, electrically connected to the first write switch and the second write switch, wherein when the memory is in the write mode and both of the first write switch and the second write switch are turned on, the latch is configured to receive and store the write data;

wherein the first write switch comprises a first transistor, the second write switch comprises a second transistor, and the latch comprises a third transistor, a fourth transistor, a fifth transistor and a sixth transistor, wherein the first, second, fourth and sixth transistors are N-type transistors, and the third and fifth transistors are P-type transistors, wherein each one of the first, second, third, fourth, fifth and sixth transistors has a first source/drain, a second source/drain and a gate, wherein the gate of the first transistor is electrically connected to the first word line, the first source/drain of the first transistor is electrically connected to the bit line, the second source/drain of the first transistor is electrically connected to the first source/drain of the second transistor, the second source/drain of the third transistor and the first source/drain of the fourth transistor, the gate of the second transistor is electrically connected to the second word line, the second source/drain of the second transistor is electrically connected to the gates of the fifth and sixth transistors, the gate of the third transistor is electrically connected to the gate of the fourth transistor, the second source/drain of the fifth transistor and the first source/drain of the sixth transistor, the first source/drain of the third transistor is electrically connected to a source voltage, the second source/drain of the fourth transistor is electrically connected to a reference voltage, the first source/drain of the fifth transistor is electrically connected to the source voltage, and the second source/drain of the sixth transistor is electrically connected to the reference voltage.

9. The memory according to claim 8, further comprising an auxiliary write switch electrically connected to a first auxiliary line, a second auxiliary line and the latch, wherein the auxiliary write switch is configured to receive auxiliary start signals transmitted from the first and second auxiliary lines, respectively, wherein when the single port SRAM memory cell is selected to store the write data, the auxiliary write switch is turned on by the auxiliary start signals to control the latch to receive and store the write data.

10. The memory according to claim 9, wherein the auxiliary write switch comprises a seventh transistor and an eighth transistor, wherein the seventh transistor is a P-type transistor and the eighth transistor is an N-type transistors, wherein each one of the seventh and eighth transistors has a first source/drain, a second source/drain and a gate, wherein the seventh transistor is disposed on an electrical path between the third transistor and the source voltage, the gate of the seventh transistor is electrically connected to the first auxiliary line, the first source/drain of the seventh transistor is electrically connected to the source voltage, and the second source/drain of the seventh transistor is electrically connected to the first source/drain of the third transistor, wherein the eighth transistor is disposed on the electrical path between the fourth transistor and the reference voltage, the gate of the eighth transistor is electrically connected to the second auxiliary line, the first source/drain of the eighth transistor is electrically connected to the second source/drain of the fourth transistor, and the second source/drain of the eighth transistor is electrically connected to the reference voltage.

11. The memory according to claim 9, wherein the auxiliary write switch comprises a ninth transistor and a tenth transistor, wherein both of the ninth and tenth transistors are N-type transistors, wherein each one of the ninth and tenth transistors has a first source/drain, a second source/drain and a gate, wherein the ninth transistor is disposed on an electrical path between the third transistor and the fourth transistor, the gate of the ninth transistor is electrically connected to the first auxiliary line, the first source/drain of the ninth transistor is electrically connected to the second source/drain of the third transistor, and the second source/drain of the ninth transistor is electrically connected to the first source/drain of the fourth transistor, wherein the tenth transistor is disposed on an electrical path between the fifth transistor and the sixth transistor, the gate of the tenth transistor is electrically connected to the second auxiliary line, the first source/drain of the tenth transistor is electrically connected to the second source/drain of the fifth transistor, and the second source/drain of the tenth transistor is electrically connected to the first source/drain of the sixth transistor.

12. The memory according to claim 8, further comprising an auxiliary write switch electrically connected to a first auxiliary line, a second auxiliary line and the latch, wherein the auxiliary write switch is configured to receive auxiliary start signals transmitted from the first and second auxiliary lines, respectively, wherein when the single port SRAM memory cell is selected to store the write data, the auxiliary write switch is turned on by the auxiliary start signals to control the latch to receive and store the write data.

13. The memory according to claim 12, wherein the auxiliary write switch comprises a seventh transistor and an eighth transistor, wherein the seventh transistor is a P-type transistor and the eighth transistor is an N-type transistor, wherein each one of the seventh and eighth transistors has a first source/drain, a second source/drain and a gate, wherein the seventh transistor is disposed on an electrical path between the third transistor and the source voltage, the gate of the seventh transistor is electrically connected to the first auxiliary line, the first source/drain of the seventh transistor is electrically connected to the source voltage, and the second source/drain of the seventh transistor is electrically connected to the first source/drain of the third transistor, wherein the eighth transistor is disposed on the electrical path between the fourth transistor and the reference voltage, the gate of the eighth transistor is electrically connected to the second auxiliary line, the first source/drain of the eighth transistor is electrically connected to the second source/drain of the fourth transistor, and the second source/drain of the eighth transistor is electrically connected to the reference voltage.

14. The memory according to claim 12, wherein the auxiliary write switch comprises a ninth transistor and a tenth transistor, wherein both of the ninth and tenth transistors are N-type transistors, wherein each one of the ninth and tenth transistors has a first source/drain, a second source/ drain and a gate, wherein the ninth transistor is disposed on an electrical path between the third transistor and the fourth transistor, the gate of the ninth transistor is electrically connected to the first auxiliary line, the first source/drain of the ninth transistor is electrically connected to the second source/drain of the third transistor, and the second source/drain of the ninth transistor is electrically connected to the first source/drain of the fourth transistor, wherein the tenth transistor is disposed on an electrical path between the fifth transistor and the sixth transistor, the gate of the tenth transistor is electrically connected to the second auxiliary line, the first source/drain of the tenth transistor is electrically connected to the second source/drain of the fifth transistor, and the second source/drain of the tenth transistor is electrically connected to the first source/drain of the sixth transistor.

* * * * *